United States Patent [19]

Yukinobu et al.

[11] Patent Number: 5,411,792
[45] Date of Patent: May 2, 1995

[54] TRANSPARENT CONDUCTIVE SUBSTRATE

[75] Inventors: Masaya Yukinobu; Munekazu Kawata, both of Niihama; Yasuo Tsukui, Nasu, all of Japan

[73] Assignees: Sumitomo Metal Mining Co., Ltd.; Tohoku Chemical Industries, Co., Ltd., both of Tokyo, Japan

[21] Appl. No.: 21,338

[22] Filed: Feb. 23, 1993

[30] Foreign Application Priority Data

| Feb. 27, 1992 | [JP] | Japan | 4-041275 |
| Apr. 9, 1992 | [JP] | Japan | 4-088980 |
| Sep. 21, 1992 | [JP] | Japan | 4-251515 |
| Sep. 21, 1992 | [JP] | Japan | 4-251516 |

[51] Int. Cl.⁶ ............................................. B32B 5/16
[52] U.S. Cl. ........................... 428/212; 252/518; 428/328; 428/697; 428/702; 428/913
[58] Field of Search ............... 428/328, 697, 702, 913, 428/212; 252/518

[56] References Cited

U.S. PATENT DOCUMENTS

| 4,345,000 | 8/1982 | Kawazoe et al. | 428/212 |
| 4,399,194 | 8/1983 | Zelez et al. | 428/457 |
| 4,559,165 | 12/1985 | Kohlmüller et al. | 252/512 |
| 4,842,703 | 6/1989 | Mueller | 204/192.29 |
| 4,977,013 | 12/1990 | Ritchie et al. | 428/212 |
| 5,110,637 | 5/1992 | Ando et al. | 428/34 |
| 5,140,450 | 8/1992 | Nikaido | 428/1 X |
| 5,147,688 | 9/1992 | Melas | 427/255.3 |
| 5,225,273 | 7/1993 | Mikoshiba et al. | 428/323 |

*Primary Examiner*—D. S. Nakarani
*Assistant Examiner*—H. Thi Le
*Attorney, Agent, or Firm*—Graham & James

[57] ABSTRACT

A transparent conductive substrate comprising a base plate member allowing transmission therethrough of visible light, a transparent overcoat layer formed on the base plate member, and a transparent conductive film which is formed on the overcoat layer, containing ultra-fine particles of indium-tin oxide having a particle size of 0.1 μm or smaller, having light transmittance of 70% or higher and exhibiting surface resistance of 200 Ω/☐ or lower. This transparent conductive substrate has low surface resistance and excellent optical characteristics.

4 Claims, 4 Drawing Sheets

TRANSPARENT CONDUCTIVE SUBSTRATE

BACKGROUND OF THE INVENTION a) Field of the Invention

The present invention relates to a transparent conductive substrate which is to be used as a transparent electrode or the like for touch panels, liquid crystal display devices, electroluminescent display elements, etc., and a method of making the transparent conductive substrate.

b) Description of the Prior Art

Transparent conductive layers are obtained generally by forming films of oxides such as indium-tin-oxide (ITO) and tin-antimony-oxide (ATO) on glass and plastic films by the sputtering method or the CVD method. However, these methods require expensive equipment and can not provide high productivity or high yield, thereby hardly permitting manufacturing of the transparent conductive layers at low costs and being not suited to manufacturing of transparent conductive layers having large areas.

For this reason, it has conventionally been carried out to form, on substrates, transparent conductive circuits by printing and setting conductive patterns of a transparent conductive ink which contains ultra-fine particles having a particle size smaller than the wavelength of visible light.

This ink contains the ultra-fine conductive particles as a filler and a resin such as thermoplastic resin, thermosetting resin or ultraviolet-setting resin as a binder as well as a solvent and a small amount of additives as dispersing agent etc. When the patterns of the transparent conductive ink printed on the glass film or the plastic film are set (by drying, heating or ultraviolet irradiation), the ultra-fine conductive particles adopted as the filler are brought into contact with one another and fixed in this condition with the resin used as the binder, thereby forming a conductive coating film. If the resin selected as the binder is used in too large an amount, the resin is interposed among the filler particles and hinders mutual contact of the particles, thereby resulting in enhancement of the surface resistance. If the resin is used in too small an amount, on the other hand, the filler particles are brought into close contact with one another and the surface resistance is low, but gaps remain among the filler particles and constitute a cause for light scattering, thereby lowering transmittance or degrading optical performance of the coating, enhancing a haze value and lowering strength of the film as well as adhesive force of the film to a substrate. Therefore, the resin as the binder should be used in an optimum amount. However, when an attempt is made to lower the surface resistance, for example, the haze value of the coating will be enhanced to such a degree as to degrade the optical performance of the film, whereby the conventional printing method was incapable of satisfying the two requirements of the low surface resistance and favorable optical performance.

Further, there is also known another method of forming a transparent conductive layer by coating a substrate made of glass or the similar material with an ink containing ultra-fine ITO particles and calcining the ink.

This method allows the ultra-fine ITO particles to be calcined at a high temperature and can provide surface resistance of a film which is far lower than that of the film prepared by the method which comprises the step to coat the substrate at the normal temperature with the ink containing the ultra-fine ITO particles. However, the method utilizing the calcination at the high temperature does not permit using a film made of a plastic material such as polyester as a base plate member and allows gaps to remain among the ultra-fine ITO particles, thereby posing, like the printing method, a problem related to optical performance of transparent conductive layers.

SUMMARY OF THE INVENTION

An object of the present invention is to provide a transparent conductive substrate which has low surface resistance and excellent optical performance and a method of making this transparent conductive substrate.

Another object of the present invention is to provide a method which permits manufacturing, at a low cost, a transparent conductive substrate having a large area and being excellent in surface smoothness thereof.

In order to attain the objects described above, the transparent conductive substrate according to the present invention comprises a light transmitting base plate member, an overcoat layer formed on the base plate member, and a transparent conductive film which is formed on the overcoat layer. The transparent conductive film contains ultra-fine particles of indium-tin-oxide (hereinafter referred to as ITO) having a particle size of 0.1 μm or smaller and has specific resistance of $5 \times 10^{-2}$ Ω.cm or lower. The transparent conductive film may contain the ultra-fine ITO particles having the particle size of 0.1 μm or smaller and may have light transmittance of 70% or higher and surface resistance of 200 Ω/□ or lower.

The method of manufacturing the transparent conductive substrate according to the present invention comprises a first step to print or apply patterns of a transparent conductive ink on a base board, and dry and calcine the ink so as to form a transparent conductive film, a second step to apply an overcoat liquid onto the transparent conductive film obtained at the first step, a third step to bond the base board to a light transmitting base plate member with the overcoat liquid or a transparent bonding agent in a condition where the overcoat layer is opposed to the base plate member, and set the overcoat layer and/or the bonding agent, and a fourth step to peel off the base board from the base plate member so as to offset the overcoat layer and the transparent conductive film to the base plate member. For the calcination, a temperature is selected at an adequate level within a range from 300° to 800° taking heat-resistance property of the base board into consideration.

In the method according to the present invention, the overcoat layer may be set immediately after the base board is bonded to the base plate member and they may be heated at the third step, and the fourth step may be replaced with another step to remove at least a portion of the base board by dissolving or swelling so as to allow the transparent conductive film to remain on the base plate member.

Another method of making the transparent conductive substrate according to the present invention comprises a first step to form, on a base board, a coating layer which contains ultra-fine particles formed of a conductive oxide and has thickness of 0.5 μm or smaller, a second step to print patterns of a transparent conductive ink on the coating layer or apply the ink to the coating layer, dry and roll the ink with a steel roller, and calcine the transparent conductive ink so as to form a transparent conductive film over the coating layer, a third step to apply a transparent overcoat liquid to the transparent conductive film so as to form a transparent overcoat layer on the transparent conductive film, a fourth step to bond the base board to a light transmitting base plate member with an overcoat liquid or a transparent bonding agent in a condition where the overcoat layer is opposed to the base plate member, and then set the overcoat layer and/or bonding agent, and a fifth step to peel off the base board from the base plate member so as to offset the overcoat layer and the transparent conductive film.

In the method according to the present invention, the coating layer may be formed by applying the transparent conductive ink on the base board or thermally treating the transparent conductive ink in an inert gas atmosphere after the ink is applied to the base board.

A still further method of making the transparent conductive substrate according to the present invention comprises a first step to apply patterns of a transparent conductive ink on a base board or thermally treat the transparent conductive ink in an inert gas atmosphere after the ink is applied on the base board so as to form, on the base board, a coating layer which consists of the transparent conductive ink and has thickness of 0.5 µm or smaller, a second step to print patterns of the transparent conductive ink or apply the ink onto the coating layer, dry and calcine the ink so as to form a transparent conductive film over the coating layer, a third step to apply a transparent overcoat liquid on the transparent conductive film so as to form a transparent overcoat layer on the transparent conductive film, a fourth step to bond the base board to a light transmitting base plate member with the overcoat liquid or a bonding agent in a condition where the overcoat layer is opposed to the base plate member, and set the overcoat layer and/or the bonding agent, and a fifth step to peel off the base board from the base plate member so as to offset the overcoat layer and the transparent conductive film to the base plate member.

In the method according to the present invention, the step to apply the patterns of the transparent conductive ink on the base board or thermally treat the transparent conductive ink in the inert gas atmosphere after the ink is applied on the base board may be replaced with another step to apply a coating liquid consisting of a resin and a solvent or thermally treat the coating liquid consisting of the resin and the solvent in an inert gas atmosphere after the coating liquid is applied on the base board.

In a preferred formation of the present invention, the base board is a glass plate, a ceramic plate, a metal plate, a metal roll, a plastic plate or a plastic roll, the transparent conductive ink consists of ultra-fine ITO particles and a solvent containing dissolved ultra-fine ITO particles and a resin, the overcoat liquid and the bonding agent consist of solutions of ultraviolet-setting resins or thermosetting resins, the base plate member is made of a plastic or glass material, the calcination is carried out at a temperature selected within a range from 300° C. to 800° C. and then at a temperature selected within a range from 300° C. to 800° C. in an inert gas atmosphere or at a temperature within a range from 300° C. to 800° C. only in a inert gas atmosphere, and any one of hydrazine, hydrazine hydrate, a mixture of hydrazine and diamine and a mixture of hydrazine hydrate and diamine is used for dissolving or swelling the base board.

Since the smoothness on the surface of the transparent conductive film of the transparent conductive substrate according to the present invention is determined by the surface smoothness of a base board, the height of irregularities on the surface of the transparent conductive film can be limited below 0.5 µm, especially below 0.2 µm, by using a smooth base board. (The transparent conductive film obtained by the conventional printing method has irregularities of 2 to 5 µm in height.) The pattern of the transparent conductive ink on the base board is printed by the screen printing method, the gravure printing method or the similar method, whereas the wire bar coating method, the doctor blade coating method, the roller coating method or the similar method is used for applying the transparent conductive ink on the base board. The ultra-fine conductive particles, which are used in a large amount as the filler in the transparent conductive ink for lowering the surface resistance of the transparent conductive film, bring about a result that the transparent conductive film is made porous or optical performance thereof is degraded. However, since the transparent conductive film is coated with the overcoat liquid which consists of a resin and a solvent, the gaps existing among the ultra-fine ITO particles in the film are filled with the resin contained in the overcoat liquid, whereby the light scattering due to the gaps is prevented and the optical performance of the film is remarkably improved. For example, the light transmittance is enhanced from 78~81% to approximately 80~83% and a haze value 10 to 12% is lowered to 3 to 5% by the coating of the overcoat liquid.

Further, the method according to the present invention allows a conductive surface consisting of the ultra-fine ITO particles to be exposed on the surface of the transparent conductive film so as to keep surface resistance of the transparent conductive film unchanged since the method comprises the step to peel off the base board from the base plate member or remove the base board by dissolving or swelling after the base board which has the transparent conductive film and the overcoat layer laminated thereon is bonded to the base plate member. The transparent conductive substrate prepared by the method according to the present invention has optical performance which is remarkably improved by the overcoat layer and a resistance value on the order of 100 Ω/□ which is obtained owing to the calcination of the ultra-fine particles at the high temperature and unavailable with the conventional printing method, whereby the transparent conductive substrate can satisfy both the requirements for optical performance and resistance characteristic at the same time.

These and other objects as well as the features and the advantages of the present invention will become apparent from the following detailed description of the preferred embodiments and the appended claims.

DESCRIPTION OF THE PREFERRED EMBODIMENTS

First Embodiment

An ITO dispersion which was prepared by dispersing ultra-fine ITO particles having a particle size of 0.03 μm (DX-101 prepared by Tohoku Chemical Industries, Co., Ltd.) was applied to a polyimide film (Kapton 300K, 75 μm thick prepared by Toray Du Pont Co., Ltd.) adopted as a base board by using a wire bar having a diameter of 0.1 mm and dried. The polyimide film coated with the ITO dispersion was heated in air at 400° for 30 minutes and then calcined in a nitrogen atmosphere for 25 minutes. Then, the polyimide film was coated with overcoat liquid 1 containing a ultraviolet-setting resin (see Table 1) by the doctor blade method until wet film thickness became 50 μm and hit by ultraviolet ray at approximately 80° for 10 minutes so as to volatilize the solvent. The polyimide film adopted as the base board was bonded to a PET film selected as a base plate member (Tetron HP-7, 100 μm thick and treated with a primer; prepared by Teijin, Ltd.) by the following manner. That is to say, this bonding was carried out by applying on the base board or the base plate member a linear pressure of 2 kgf/cm with a steel roller. After the bonding, the ultraviolet-setting resin was set by irradiating for 15 seconds on the bonded base board and base plate member with ultraviolet light at an intensity of 150 mW/cm$^2$ emitted from a metal halide lamp for joining the base plate member to the base board. After this, the base board was peeled off to offset the ITO conductive layer to the base plate member and a transparent conductive substrate was manufactured. The equipment used for irradiating the ultraviolet light consisted of Metal Halide Lamp M01-L212, Irradiator (cold mirror type) UE011-201C, Power Source Unit UB01.51-3A/BM-E2 and a heat ray cutoff filter which were prepared by Eye Graphics Co., Ltd.

Figure 1A:
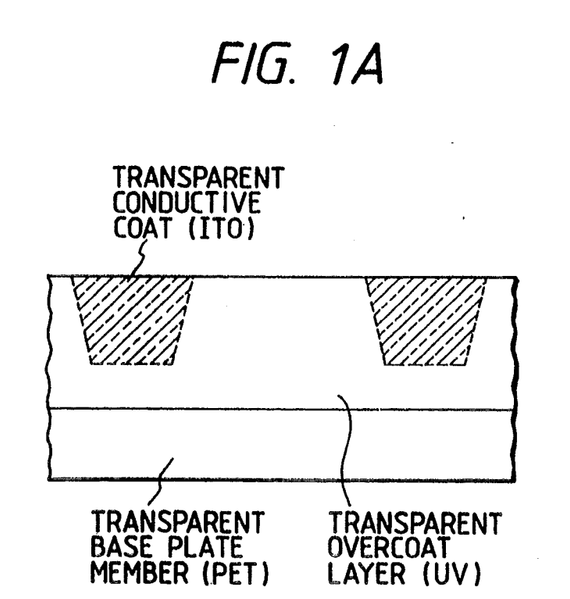
FIG. 1A is a diagram illustrating the structure of first embodiment of the transparent conductive substrate according to the present invention.
Figure 1B:
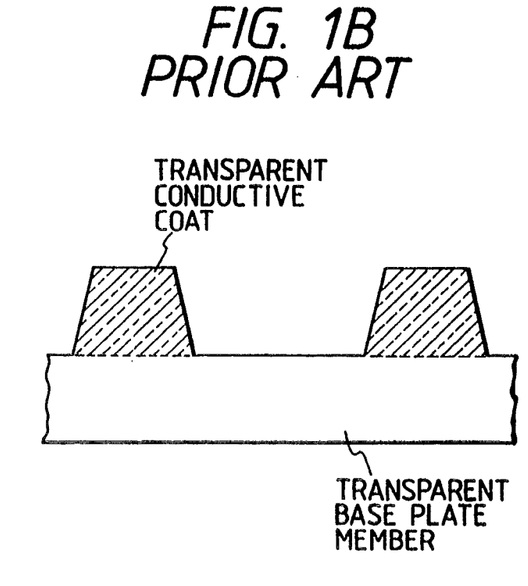
FIG. 1B is a diagram illustrating the structure of the conventional transparent conductive substrate.

As an example for comparison with the transparent conductive substrate obtained by the offsetting, prepared was another transparent conductive substrate which was manufactured simply by printing and drying patterns of the transparent conductive ink on the base board without coating the overcoat layer thereon. Light transmittance, haze values and surface resistance values of both the transparent conductive substrates were measured. Results of the measurements are summarized in Table 2. Measurements of surface roughness of the transparent conductive substrates mentioned above indicated surface irregularities smaller than 0.2 μm. For obtaining the results listed in Table 2, Direct Readout Haze Computer HGM-ZDP prepared by Suga Testing Machine K. K. was adopted for measuring light transmittance, taken as an average of transmittance at wavelengths varying over the visible spectrum, and haze values of the transparent conductive substrates and the transparent conductive layers as well as those of the base boards and the PET films used as the base plate members, whereas the surface resistance values were measured with Loresta MCP-T400 prepared by Mitsubishi Petrochemical Co., Ltd. Further, surface roughness and film thickness were measured with Surface Roughness Measuring Instrument Surfcom 900A prepared by Tokyo Seimitsu Co., Ltd. Structures of the transparent conductive substrate preferred as the first embodiment and the conventional transparent conductive substrate prepared as the comparison example are illustrated in FIG. 1A and FIG. 1B respectively.

Second Embodiment

Figure 2:
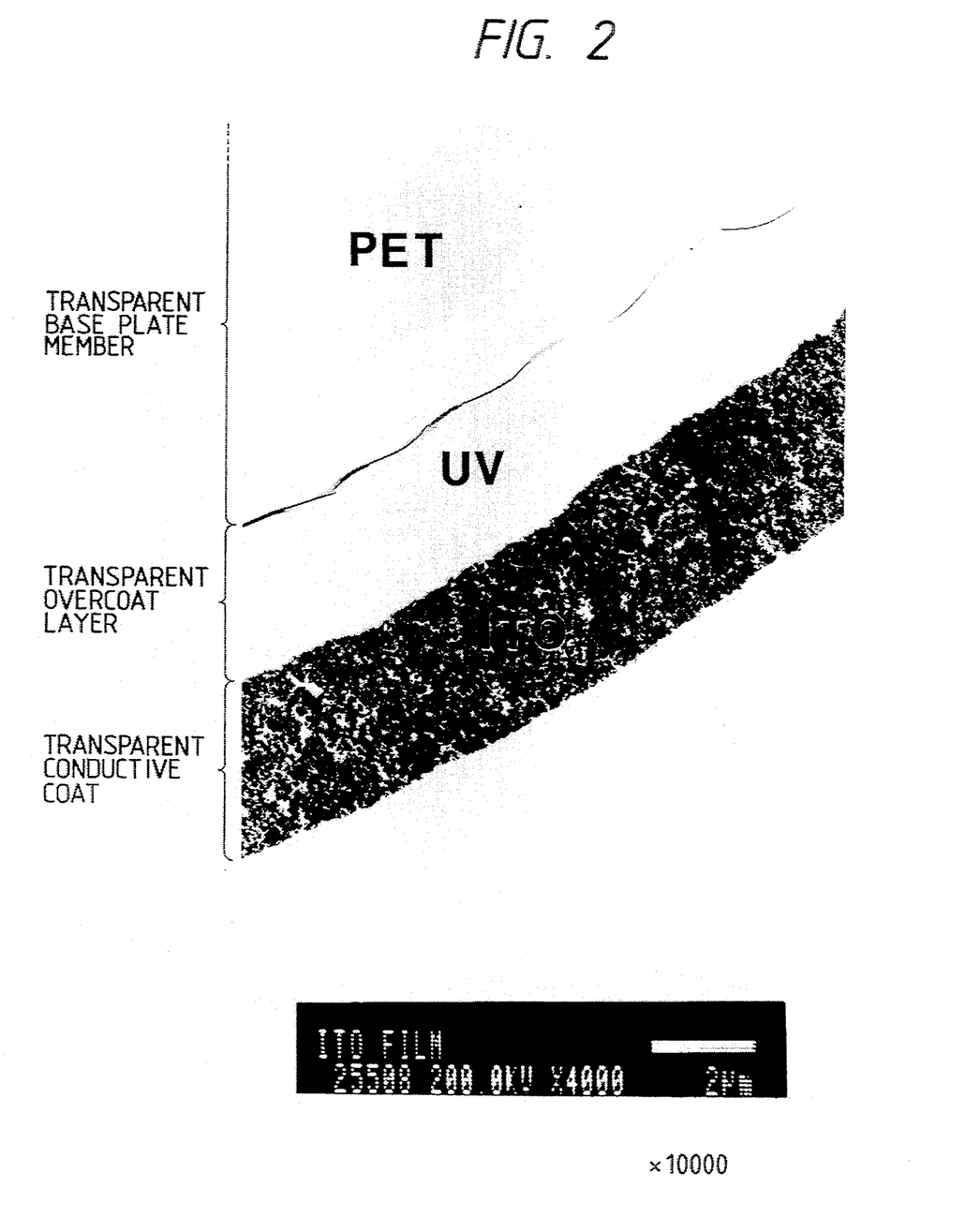
FIG. 2 is a transmission electron micrograph illustrating details of the structure of second embodiment of the transparent conductive substrate according to the present invention.

A transparent conductive substrate was manufactured in the same procedures as those of the first embodiment, except for a step wherein a polyimide film selected as a base board was coated, by the screen printing method, with patterns each having a size of 5 cm×5 cm and 3 μm thick of a transparent conductive ink which was prepared by dispersing ultra-fine ITO particles having a particle size of 0.03 μm in a liquid containing an acrylic resin dissolved in an organic solvent (X-101 prepared by Tohoku Chemical Industries Co., Ltd.). Light transmittance, a haze value and surface resistance were measured by using the equipment mentioned in the first embodiment and are summarized in Table 2. In the second embodiment wherein the surface resistance has a value of 40 Ω/□, as in Table 8 and thickness of the transparent ink is 3 μm ($3 \times 10^{-4}$ cm) specific resistance of the transparent conductive substrate is calculated as 40 Ω/□$\times 3 \times 10^{-4}$ cm = $1.2 \times 10^{-2}$ Ω.cm. The structure of the transparent conductive substrate according to this embodiment is as shown in FIG. 2.

Third Embodiment

A transparent conductive substrate was manufactured with the same materials, under the same conditions and in the same procedures as those used for the first embodiment, except for overcoat liquid 2 and a Soda-Lime Glass Plate AS (1 mm thick, prepared by Asahi Glass Co., Ltd.) which were used in place of the overcoat liquid 1 and the PET film respectively. Light transmittance, a haze value and surface resistance of this transparent conductive substrate were measured with the equipment used in the first embodiment and measured results are listed in Table 2.

Fourth Embodiment

A transparent conductive substrate was manufactured by offsetting patterns of an ITO conductive film which was calcined by the same process as that in the first embodiment onto a PET film using overcoat liquid 3 (see Table 1). Light transmittance, a haze value and surface resistance of the transparent conductive substrate were measured with the measuring equipment used in the first embodiment and measured results listed in Table 2 were obtained.

Fifth Embodiment

To a polyimide film which was preliminarily thermally treated in a nitrogen atmosphere at 500° for 15 minutes for use as a base board, patterns of the ITO dispersion (DX-101) were applied by using a wire bar having a diameter of 0.1 mm, dried, and then calcined in air at 400° for 30 minutes and successively in a nitrogen gas atmosphere at 500° for 15 minutes. A transparent conductive substrate was manufactured by offsetting the patterns of calcined ITO dispersion onto a PET film which was treated with a primer and selected as a base plate member in the same procedures as that used in the first embodiment, and light transmittance, a haze value and surface resistance of the transparent conductive substrate were measured with the same equipment as that used in the first embodiment. Obtained results are summarized in Table 2.

Sixth Embodiment

After adding 2.5 g of isophorone to 10 g of the ITO dispersion (DX-101) and diluting the dispersion, a transparent conductive substrate was manufactured by the same method adopted for the fourth embodiment. Light transmittance, a haze value and surface resistance of the transparent conductive substrate were measured with the same measuring equipment as that used in the first embodiment and summarized in Table 2.

TABLE 1

| Kind | Composition | Percent by weight |
| --- | --- | --- |
| Overcoat liquid 1 | Novolak vinyl ester resin | 46.6 |
| | Trimethylolpropane triacrylate | 11.7 |
| | 2-hydroxy-2-methyl-1-phenyl-propanon-1 | 1.7 |
| | Methylethylketone | 40.0 |
| Overcoat liquid 2 | Novolak vinyl ester resin | 45.3 |
| | Trimethylolpropane triacrylate | 11.3 |
| | 2-hydroxy-2-methyl-1-phenyl-propanon-1 | 1.7 |
| | Organosilane (KBM-503 prepared by Shin-etsu Chemical Industry Co., Ltd.) | 1.7 |
| | Methylethylketone | 40.0 |
| Overcoat liquid 3 | Ultraviolet-setting resin (Koei Hard M-101 Kai 11 prepared by Koei Chemical Co., Ltd.) | 60.0 |
| | Methylethylketone | 40.0 |
| Overcoat liquid 4 | Ultraviolet-setting resin (Koei Hard M-101 prepared by Koei Chemical Co., Ltd.) | 60.0 |
| | Methylethylketone | 40.0 |
| Overcoat liquid 5 | Ultraviolet-setting resin (Koei Hard T-102 Kai 1 prepared by Koei Chemical Co., Ltd.) | 60.0 |
| | Methylethylketone | 40.0 |
| Bonding agent 1 | Thermosetting resin (Epikote 828 prepared by Yuka Shell Epoxy K.K.) | 88.0 |
| | Setting agent (Triethylenetetramine) | 12.0 |
| Coating liquid 1 | Ultra-fine ITO particles (UFP-YX prepared by Sumitomo Metal Mining Co., Ltd.) | 4.4 |
| | Acrylic resin | 1.1 |
| | Isophorone | 94.5 |
| Coating liquid 2 | Ultra-fine ITO particles (UFF-YX prepared by Sumitomo Metal Mining Co., Ltd.) | 4.4 |

TABLE 1-continued

| Kind | Composition | Percent by weight |
| --- | --- | --- |
| | Sianoethyl cellulose | 1.1 |
| | Cyclohexane | 94.5 |
| Coating liquid 3 | Ultra-fine ITO particles (UFP-HX prepared by Sumitomo Metal Mining Co., Ltd.) | 6.3 |
| | Cyanoresin (CR-S prepared by Shin-etsu Chemical Industry Co., Ltd.) | 6.3 |
| | Cyclohexane | 87.4 |
| Coating liquid 4 | Ultra-fine ITO particles (UFP-HX prepared by Sumitomo Metal Mining Co., Ltd.) | 5.0 |
| | Acrylic resin | 5.0 |
| | Isophorone | 90.0 |
| Coating liquid 5 | Cyanoresin (CR-S prepared by Shin-etsu Chemical Industry Co., Ltd.) | 1.0 |
| | Cyclohexane | 99.0 |
| Coating liquid 6 | Cyanoresin (CR-S prepared by Shin-etsu Chemical Industry Co., Ltd.) | 10.0 |
| | Cyclohexane | 90.0 |

TABLE 2

| | Base board | Base plate member | | Physical properties of transparent conductive substrate | | | |
| --- | --- | --- | --- | --- | --- | --- | --- |
| | | | | Surface resistance ($\Omega/\square$) | Light transmittance (%) | Haze value (%) | Offset state |
| First embodiment | Polyimide film | PET film treated with primer | Calcined film Offset film | 85 90 | Immeasurable 82.6 | Immersurable 2.6 | Favorable |
| Second embodiment | Polyimide film | PET film treated with primer | Calcined film Offset film | 30 40 | Immeasurable 77.6 | Immeasurable 5.1 | Favorable |
| Third embodiment | Polyimide film | Glass plate | Calcined film Offset film | 80 80 | Immeasurable 84.5 | Immeasurable 1.9 | Favorable |
| Fourth embodiment | Polyimide film | PET film treated with primer | Calcined film Offset film | 95 95 | Immeasurable 82.4 | Immeasurable 2.8 | Favorable |
| Fifth embodiment | Polyimide film (calcined in $N_2$ at 500° C. for 15 min.) | PET film treated with primer | Calcined film Offset film | 50 50 | Immeasurable 80.5 | Immeasurable 2.5 | Favorable |
| Sixth embodiment | Polyimide film | PET film treated with primer | Calcined film Offset film | 100 110 | Immeasurable 84.5 | Immeasurable 2.4 | Favorable |

Seventh Embodiment

Patterns of the ITO dispersion (DX-101) were applied on a soda-lime glass plate (1 mm thick) selected as the base board by using a wire bar having a diameter of 0.1 mm, dried at approximately 80° C., and then calcined in air at 550° C. for 30 minutes and successively in a nitrogen gas atmosphere at 550° C. for 10 minutes. The overcoat liquid 3 (a solution consisting of 60% by weight of the ultraviolet-setting resin (Koei Hard M-101 Kai 11 prepared by Koei Chemical Co., Ltd.) and 40% by weight of methylethylketone) was coated over the ITO dispersion until a wet film had thickness of 50 μm and heated at 120° for 10 minutes for volatilization of a solvent. The base board was bonded to a PET film used as the base plate member (100 μm thick). The bonding was carried out by applying on the base board or the PET film and a linear pressure of 2 kgf/cm with a steel roller. After the bonding, the bonded assembly was heated to 120° C. as a whole and then immediately the patterns were set by irradiating for 15 seconds with ultraviolet light at an intensity of 150 mW/cm² emitted from a metal halide lamp for joining the base plate member to the base board. After cooling the assembly, the base board was peeled off to the offset the ITO conductive layer to the base plate member and a transparent conductive substrate was manufactured in this way. Light transmittance, a haze value and surface resistance of the transparent conductive substrate were measured with the same measuring equipment as that used in the first embodiment and obtained results are summarized in Table 3.

Eighth Embodiment

A low-alkali glass plate AT (1 mm thick, prepared by Asahi Glass Co., Ltd.) was selected as the base board. After an ITO film was formed by the same process as that described in the seventh embodiment, the film was calcined in air at 650° C. for 30 minutes and successively in a nitrogen atmosphere at 650° for 10 minutes. A transparent conductive substrate was obtained through the same processes as those described in the seventh embodiment. The results listed in Table 3 were obtained by measuring light transmittance, a haze value and surface resistance of the transparent conductive substrate with the same measuring equipment as that used in the first embodiment.

Ninth Embodiment

A low-alkali glass plate (1 mm thick) was adopted the base board. Patterns of the ITO dispersion (DX-101) were coated by using a wire bar having a diameter of 0.15 mm and dried at approximately 80° C. A transparent conductive substrate was obtained by treating the glass plate through the same procedures as those described in the eighth embodiment. By measuring light transmittance, a haze value and surface resistance of the transparent conductive substrate with the equipment used in the first embodiment, the results listed in Table 3 were obtained.

Comparison Example 1

A soda-lime glass plate (1 mm thick) and a PET film (100 μm thick) were selected as the base board and the base plate member respectively. After bonding the base board to the base plate member through the same procedures or steps as those used in the seventh embodiment, a transparent conductive substrate was manufactured by setting an overcoat layer at the normal temperature without heating it to 120° for offsetting the ITO film. Light transmittance, a haze value and surface resistance of the transparent conductive substrate were measured with the same equipment used in the first embodiment and obtained results are summarized in Table 3.

TABLE 2

| | Base board | Base plate member | Application of ITO to base board | Calcining conditions | | Physical properties of transparent conductive substrate | | | |
|---|---|---|---|---|---|---|---|---|---|
| | | | | | | Surface resistance ($\Omega/\square$) | Light transmittance (%) | Haze value (%) | Offset state |
| Seventh embodiment | Soda-lime glass plate | PET film treated with primer | Wire bar 0.1 mm in dia. | 550° C. for 30 min. in air | Calcined film | 30 | 81.6 | 4.0 | Favorable |
| | | | | 550° C. for 10 min. in $N_2$ | Offset film | 28 | 82.0 | 2.4 | |
| Eighth embodiment | Low-alkali glass plate | PET film treated with primer | Wire bar 0.1 mm in dia. | 650° C. for 30 min. in air | Calcined film | 16 | 81.8 | 4.1 | Favorable |
| | | | | 650° C. 10 min. in $N_2$ | for film Offset | 18 | 82.3 | 2.5 | |
| Ninth embodiment | Low-alkali glass plate | PET film treated with primer | Wire bar 0.15 mm in dia. | 650° C. for 30 min. in air | Calcined film | 12 | 79.7 | 7.5 | Favorable |
| | | | | 650° C. for 10 min. in $N_2$ | Offset film | 10 | 80.6 | 2.8 | |
| Comparison example 1 | Soda-lime glass plate | PET film treated with primer | Wire bar 0.1 mm in dia. | 550° C. for 30 min. in air | Calcined film | 40 | 81.5 | 4.1 | Offset only partially (scarcely offset) |
| | | | | 550° C. for 10 min. in $N_2$ | Offset film | Immeasurable | Immeasurable | Immeasurable | |

Tenth Embodiment

Used in the tenth embodiment were a transparent conductive ink which contained ultra-fine ITO particles having a particle size of 0.03 μm as a filler and a thermosetting resin as a binder (X-101 prepared by Tohoku Chemical Industries Co., Ltd.). After applying the transparent conductive ink over a polyimide film (Kapton KA-300, 75 μm thick, prepared by Toray Du Pont Co., Ltd.) adopted as the base board by the screen printing method until thickness of the ink layer became 3 μm, the layer was dried, and then calcined in air at 400° C. for 30 minutes and in nitrogen at 400° C. for 25 minutes. Then, the overcoat liquid 3 containing the ultraviolet-setting resin (see Table 1) was coated over the transparent conductive film by using a wire bar having a diameter of 0.3 mm, and dried at room temperature for 5 minutes and at 50° C. for 10 minutes respectively. The base board on which the transparent conductive film and the overcoat layer were formed as described above was bonded to a PET film selected as the base plate member (100 μm thick).

The bonding was carried out by overlapping the base plate member with the base board so that the overcoat layer is opposed to the base plate member and applying a linear pressure of 2 kgf/cm with a steel roller. The assembly of the bonded base board and the base plate member was irradiated with ultraviolet light emitted from a metal halide lamp positioned on the side of the base plate member. The ITO dispersion and the overcoat liquid were set for 10 seconds at an intensity of 150 mW/cm². After the setting, the assembly of the base board and the base plate member was dipped for 10 minutes into a hydrazine hydrate heated to a temperature of approximately 40° C. for dissolving polyimide used as the base board, washed with pure water and dried so as to form a transparent conductive film and an overcoat layer on the base plate member. The ultraviolet irradiator was the same as that used in the first embodiment.

Light transmittance, a haze value and surface resistance of a transparent conductive substrate thus obtained were measured and are listed in Table 4. A measurement of surface roughness of the transparent conductive substrate indicated surface irregularities smaller than 0.2 μm. The measuring instruments used for these measurements were the same as those described in the first embodiment.

Eleventh Embodiment

A transparent conductive substrate was manufactured with the same materials, under the same conditions and in the same procedures used for the tenth embodiment, except for a step at which the ITO dispersion (DX-101) was coated over the base board by using a wire bar having a diameter of 0.1 mm. Measurements of light transmittance, a haze value and surface resistance of the transparent conductive substrate with the measuring equipment used for the first embodiment indicated the results listed in Table 4.

Twelfth Embodiment

A transparent conductive substrate was manufactured through the same materials, conditions and procedures used for the eleventh embodiment, except for a step at which the ITO dispersion was calcined in a nitrogen atmosphere at 500° for 15 minutes. Measurements of light transmittance, a haze value and surface resistance of the transparent conductive substrate with the same equipment used for the first embodiment provided the results summarized in Table 4.

Thirteenth Embodiment

A transparent conductive film was printed, dried and calcined on the base board in the procedures described with reference to the tenth embodiment, whereafter an overcoat liquid was coated over the base board, dried and then set in air with ultraviolet light at an intensity of 150 mW/cm² emitted from a metal halide lamp. After the setting of the overcoat layer, a soda-lime glass plate selected as the base plate member (1 mm thick) was bonded to the base board with the thermosetting bonding agent 1 (see Table 1). For the bonding, the bonding agent was coated over the base plate member by the doctor blade method until a wet film became 50 μm thick, overlapping the base board with the base plate member so that the overcoat layer was opposed to the base plate member and applying a linear pressure of 2 kgf/cm. After heating the assembly of the bonded base board and base plate member at 120° for 3 hours for setting to the thermally set the bonding agent, a transparent conductive substrate was manufactured by dissolving or removing the polyimide used as the base board by the same method as that adopted for the tenth embodiment. Measurements of light transmittance, a haze value and surface resistance of the transparent conductive substrate with the same equipment used for the first embodiment indicated the results which are listed in Table 4.

Fourteenth Embodiment

Used as the base board was a soda-lime glass plate (1 mm thick) which was coated with a polyimide varnish (PI-400 prepared by Ube Industries, Ltd.) by using a wire bar having a diameter of 0.1 mm and dried at 200° C. After forming a transparent conductive film on this base board by the procedures adopted for the twelfth embodiment, the base board was bonded to a base plate member and then an overcoat layer was set. Since adhesion between the glass plate used as the base board and the polyimide layer was weak, the polyimide layer was peeled off from the interface thereof and the base plate member was dipped for 5 minutes in a mixture solution containing hydrazine hydrate and ethylenediamine at a ratio of 1:1 and kept at 40° C. for swelling the polyimide and rubbed lightly with cloth. The polyimide layer was removed completely in this way. Then, a transparent conductive substrate was manufactured by washing the base plate member with pure water and drying it. Light transmittance, a haze value and surface resistance of the transparent conductive substrate were measured with the equipment used in the first embodiment and the results listed in Table 4 were obtained.

Comparison Example 2

A transparent conductive substrate was manufactured by printing patterns of the transparent conductive ink (X-101) on a soda-lime glass plate selected as the base plate member by the screen printing method so that the patterns have thickness of 3 μm, drying the patterns, and calcining the patterns in air at 400° C. for 30 minutes and then in nitrogen gas atmosphere at 500° C. for 25 minutes. Light transmittance, a haze value and surface resistance of the transparent substrate were measured with the equipment used for the first embodiment and the results listed in Table 4 were obtained.

TABLE 4

|  | Base board | Base plate member | Calcining conditions for transparent conductive film | Physical properties of transparent conductive substrate | | | Coating method for transparent conductive film |
|---|---|---|---|---|---|---|---|
|  |  |  |  | Surface resistance (Ω/□) | Light transmittance (%) | Haze value (%) |  |
| Tenth embodiment | Polyimide film | PET film treated with primer | 400° C. × 30 min., air 400° C. × 25 min., N₂ | 65 | 77.9 | 6.4 | Screen printing method |
| Eleventh embodiment | Polyimide film | PET film treated with primer | 400° C. × 30 min., air 400° C. × 25 min., N₂ | 146 | 82.5 | 2.8 | Wire bar method, φ0.1 mm |

TABLE 4-continued

|  | Base board | Base plate member | Calcining conditions for transparent conductive film | Physical properties of transparent conductive substrate | | | Coating method for transparent conductive film |
|---|---|---|---|---|---|---|---|
|  |  |  |  | Surface resistance (Ω/□) | Light transmittance (%) | Haze value (%) |  |
| Twelfth embodiment | Polyimide film | PET film treated with primer | 500° C. × 15 min., N$_2$ | 98 | 81.9 | 2.6 | Wire bar method, φ0.1 mm |
| Thirteenth embodiment | Polyimide film | Glass plate | 400° C. × 30 min., air 400° C. × 25 min., N$_2$ | 72 | 78.1 | 6.1 | Screen printing method |
| Fourteenth embodiment | Glass plate coated with polyimide | PET film treated with primer | 500° C. × 15 min., N$_2$ | 90 | 82.0 | 2.2 | Wire bar method, φ0.1 mm |
| Comparison example 2 | Glass plate |  | 400° C. × 30 min., air 400° C. × 25 min., N$_2$ | 53 | 77.9 | 11.9 | Screen method |

Fifteenth Embodiment

The coating liquid 1 containing ultra-fine ITO particles having a particle size of 0.03 μm as a filler and acrylic resin as a binder (see Table 1) was coated over a polyimide film (Kapton 300KB, 75 μm thick prepared by Toray Du Pont Co., Ltd.) and dried with far-infrared light so as to form a film of approximately 0.3 μm thick. This film was thermally treated in a nitrogen atmosphere at 400° for 10 minutes for forming a coating layer by carbonizing the acrylic resin. The ITO dispersion (DX-101) was coated over the coating layer with a wire bar having a diameter of 0.075 mm and dried.

A transparent conductive layer thus obtained was rolled under a linear pressure of 100 kgf/cm by using two steel rollers which were plated with hard chromium and had a diameter of 150 mm. Then, a transparent conductive film was formed by heating the transparent conductive layer in air at 400° for 30 minutes and then in a nitrogen atmosphere at 400° for 25 minutes. This transparent conductive film was coated with the overcoat liquid 3 (see Table 1) containing a ultraviolet-setting resin by using a wire bar having a diameter of 0.3 mm, and dried at room temperature for 5 minutes and at 50° for 10 minutes. A base board on which the transparent conductive film and the overcoat layer were formed as described above was bonded to a PET film (100 μm thick) selected as the base plate member.

The bonding was carried out under a linear pressure of 2 kgf/cm by using a steel roller. After the bonding, the PET film which was treated for use as the base plate member was bonded by performing setting for 15 seconds with ultraviolet light at an intensity of 150 mW/cm$^2$ emitted from a metal halide lamp, and the base board was peeled off for offsetting the transparent conductive ITO film to the base plate member, thereby manufacturing a transparent conductive substrate. The ultraviolet irradiator which was used for the first embodiment was employed also for the fifteenth embodiment.

Figure 3:
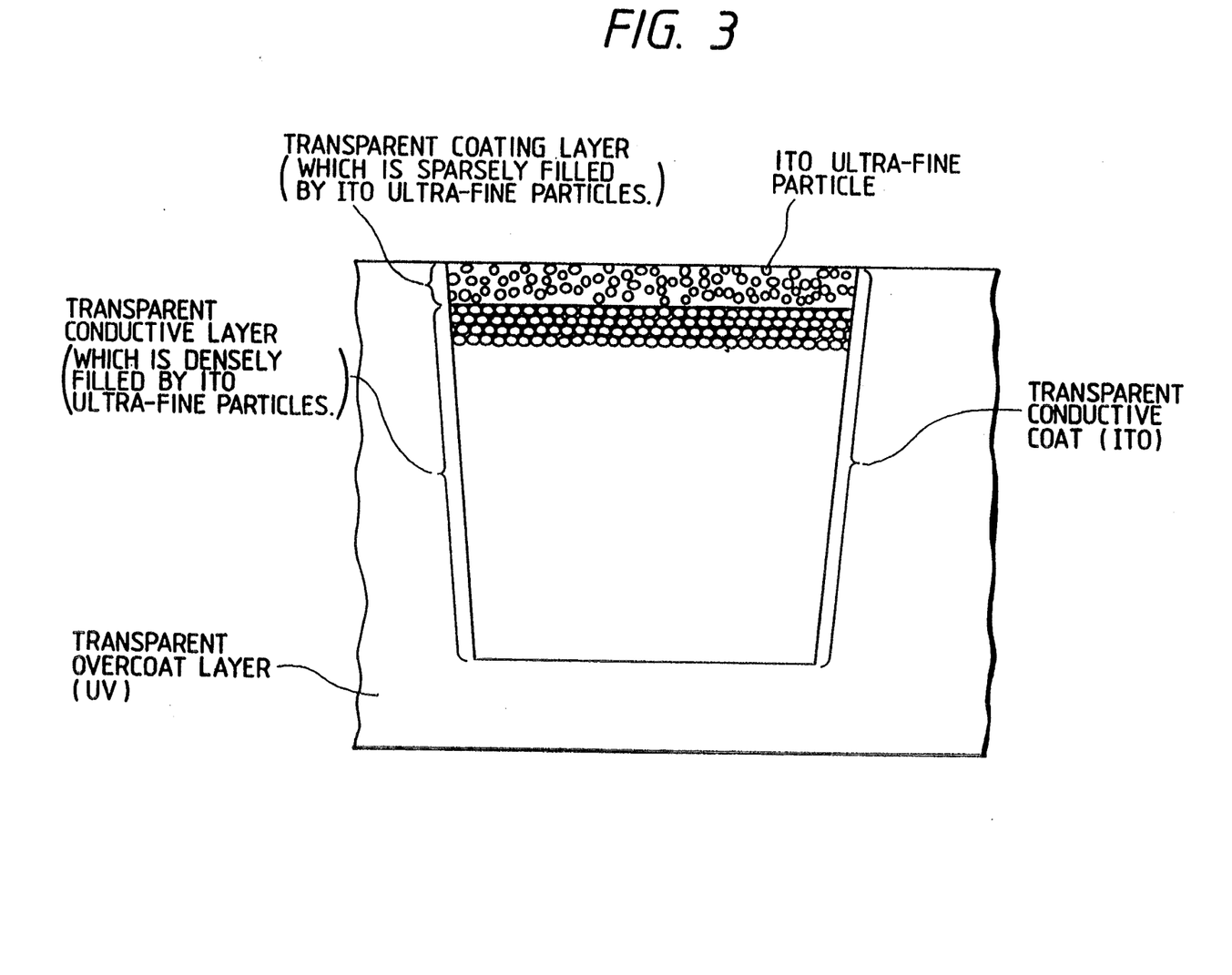
FIG. 3 is a diagram illustrating details of the structure of fifteenth embodiment of the transparent conductive substrate according to the present invention.

Light transmittance, a haze value and surface resistance of the transparent conductive substrate were measured as listed in Table 5. Further, a measurement of surface roughness of this transparent conductive substrate indicated surface irregularities of 0.2 μm or smaller. Used for these measurements were the instruments which were employed for the first embodiment. Structure of the transparent conductive substrate preferred as the fifteenth embodiment is illustrated in FIG. 3.

Sixteenth Embodiment

A transparent conductive substrate was manufactured with the same materials, under the same conditions and in the same procedures as those selected for the fifteen embodiment, except for a step at which the transparent conductive layer obtained in the fifteenth embodiment was rolled under a linear pressure of 200 kgf/cm by using two steel rollers which were plated with hard chromium and had a diameter of 150 mm. The results listed in Table 5 were obtained by measuring light transmittance, a haze value and surface resistance of the transparent conductive substrate.

Seventeenth Embodiment

A transparent conductive substrate was manufactured with the same materials, under the same conditions and in the same procedures as those used for the fifteenth embodiment, except for a step at which the transparent conductive layer obtained in the fifteenth embodiment was rolled under a linear pressure of 300 kgf/cm by using two steel rollers which were plated with hard chromium and had a diameter of 150 mm. The results summarized in Table 5 were obtained by measuring light transmittance, a haze value and surface resistance of the transparent conductive substrate with the measuring equipment employed for the first embodiment.

Eighteenth Embodiment

A transparent conductive substrate was manufactured with the same materials, under the same conditions and in the same procedures as those selected for the fifteenth embodiment, except for a step at which the transparent conductive layer obtained in the fifteenth embodiment was calcined in a nitrogen gas atmosphere at 500° for 15 minutes, then in air at 400° C. for 30 minutes and successively in a nitrogen gas atmosphere at 400° for 25 minutes. The results listed in Table 5 were obtained by measuring light transmittance, a haze value and surface resistance of the transparent conductive substrate by using the measuring equipment adopted for the first embodiment.

Nineteenth Embodiment

A transparent conductive substrate was manufactured with the same materials, under the same conditions and in the same procedures as those selected for the eighteenth embodiment, except for a step at which the transparent conductive layer obtained in the fifteenth embodiment was rolled under a linear pressure of 200 kgf/cm by using two steel rollers which were plated with hard chromium and had a diameter of 150 mm. Measurements of light transmittance, a haze value and surface resistance of the transparent conductive substrate with the same measuring equipment as that employed for the first embodiment indicated the results listed in Table 5.

Twentieth Embodiment

A transparent conductive substrate was manufactured with the same materials, under the same conditions and in the same procedures as those selected for the eighteenth embodiment, except for a step at which the transparent conductive layer obtained in the fifteenth embodiment was rolled under a linear pressure of 300 kgf/cm by using two steel rollers which were plated with hard chromium and had a diameter of 150 mm. The results listed in Table 5 were obtained by measuring light transmittance, a haze value and surface resistance of the transparent conductive substrate with the measuring equipment adopted for the first embodiment.

equipment used for the first embodiment indicated the results summarized in Table 5.

Twenty-second Embodiment

A transparent conductive substrate was manufactured with the same materials, under the same conditions and in the same procedures as those selected for the fifteenth embodiment, except for a fact that the base plate member was a soda-lime glass plate (1 mm thick) which was coated with a silicon primer (Silicon Primer AP-133 prepared by Nippon Unicar Co., Ltd.) and treated for drying. The results summarized in Table 5 were obtained by measuring light transmittance, a haze value and surface resistance of the transparent conductive substrate with the measuring equipment adopted for the first embodiment.

Comparison Example 3

A transparent conductive substrate was manufactured with the same materials, under the same conditions and in the same procedures as those selected for the fifteenth embodiment, except for a fact that a coating layer was not formed on the base board. The results obtained by measuring light transmittance, a haze value and surface resistance of the transparent conductive substrate with the measuring equipment adopted for the first embodiment are listed in Table 5.

TABLE 5

| | Calcining conditions | Linear pressure for rolling with steel roller (kgf/cm) | Surface resistance ($\Omega/\square$) | Light transmittance (%) | Haze value (%) | Remarks |
|---|---|---|---|---|---|---|
| Fifteenth embodiment | 400° C. × 30 min., air<br>400° C. × 25 min., $N_2$ | 100 | 68 | 85.7 | 4.0 | |
| Sixteenth embodiment | 400° C. × 30 min., air<br>400° C. × 30 min., $N_2$ | 200 | 52 | 84.6 | 4.6 | |
| Seventeenth embodiment | 400° C. × 30 min., air<br>400° C. × 30 min., $N_2$ | 300 | 40 | 84.2 | 3.8 | |
| Eighteenth embodiment | 500° C. × 15 min., $N_2$<br>400° C. × 30 min., air<br>400° C. × 25 min., $N_2$ | 100 | 38 | 86.5 | 4.7 | |
| Nineteenth embodiment | 500° C. × 15 min., $N_2$<br>400° C. × 30 min., air<br>400° C. × 25 min., $N_2$ | 200 | 36 | 86.3 | 4.0 | |
| Twentieth embodiment | 500° C. × 15 min., $N_2$<br>400° C. × 30 min., air<br>400° C. × 25 min., $N_2$ | 300 | 34 | 85.4 | 4.4 | |
| Twenty-first embodiment | 400° C. × 30 min., air<br>400° C. × 25 min., $N_2$ | 100 | 69 | 85.2 | 4.1 | |
| Twenty-second embodiment | 400° C. × 30 min., air<br>400° C. × 25 min., $N_2$ | 100 | 65 | 86.6 | 3.5 | |
| Comparison example 3 | 400° C. × 30 min., air<br>400° C. × 25 min., $N_2$ | 100 | Immeasurable | Immeasurable | Immeasurable | Not offset partially |

Twenty-first Embodiment

A transparent conductive substrate was manufactured with the same materials, under the same conditions and in the same procedures as those selected for the fifteenth embodiment, except for a step at which a coating layer approximately 0.3 μm thick was formed by coating the coating liquid 2 (see Table 1) which contained ultra-fine ITO particles having a particle size of 0.03 μm as the filler and cyanoethyl cellulose as the binder over a polyimide film selected as the base board by using a wire bar having a diameter of 0.075 mm and drying the coating liquid. Measurements of light transmittance, a haze value and surface resistance of the transparent conductive substrate with the measuring

Twenty-third Embodiment

On a soda-lime glass plate (60 mm long by 120 mm wide by 3 mm thick) selected as the base board, a coating layer 0.4 μm thick was formed by applying the coating liquid 3 (see Table 1) containing ultra-fine ITO particles having a particle size of 0.03 μm as the filler and cyanoresin as the binder and drying the coating liquid with far-infrared light at 50° for 5 minutes. After applying the ITO dispersion (DX-101) onto the coating layer with a wire bar having a diameter of 0.075 mm, a transparent conductive layer 2.0 μm thick was formed on the coating layer by drying the ITO dispersion with heat of far-infrared light at 50° C. for 5 minutes.

A transparent conductive film was formed by calcining the transparent conductive layer in air at 550° for 1 hour and then in nitrogen gas atmosphere at 550° for 15 minutes. After coating the transparent conductive film with the overcoat liquid 4 (see Table 1) containing a ultraviolet-setting resin by using a wire bar having a diameter of 0.3 mm, a solvent was removed by drying with heat of far-infrared light at 50° for 5 minutes. The base board on which the coating layer and the transparent conductive film were formed as described above was bonded to a base plate member which was a PET film (100 μm thick) treated with a primer under a linear pressure of 10 kgf/cm by using a steel roller.

After the bonding, the overcoat layer was set by irradiating for 10 seconds with ultraviolet light at an intensity of 150 mW/cm² emitted from a metal halide lamp and the base board was peeled off for offsetting the transparent conductive film to the base plate member. A transparent conductive substrate was manufactured in this way. The ultraviolet light irradiator used in the twenty-third embodiment was the same as that adopted for the first embodiment.

Figure 4:
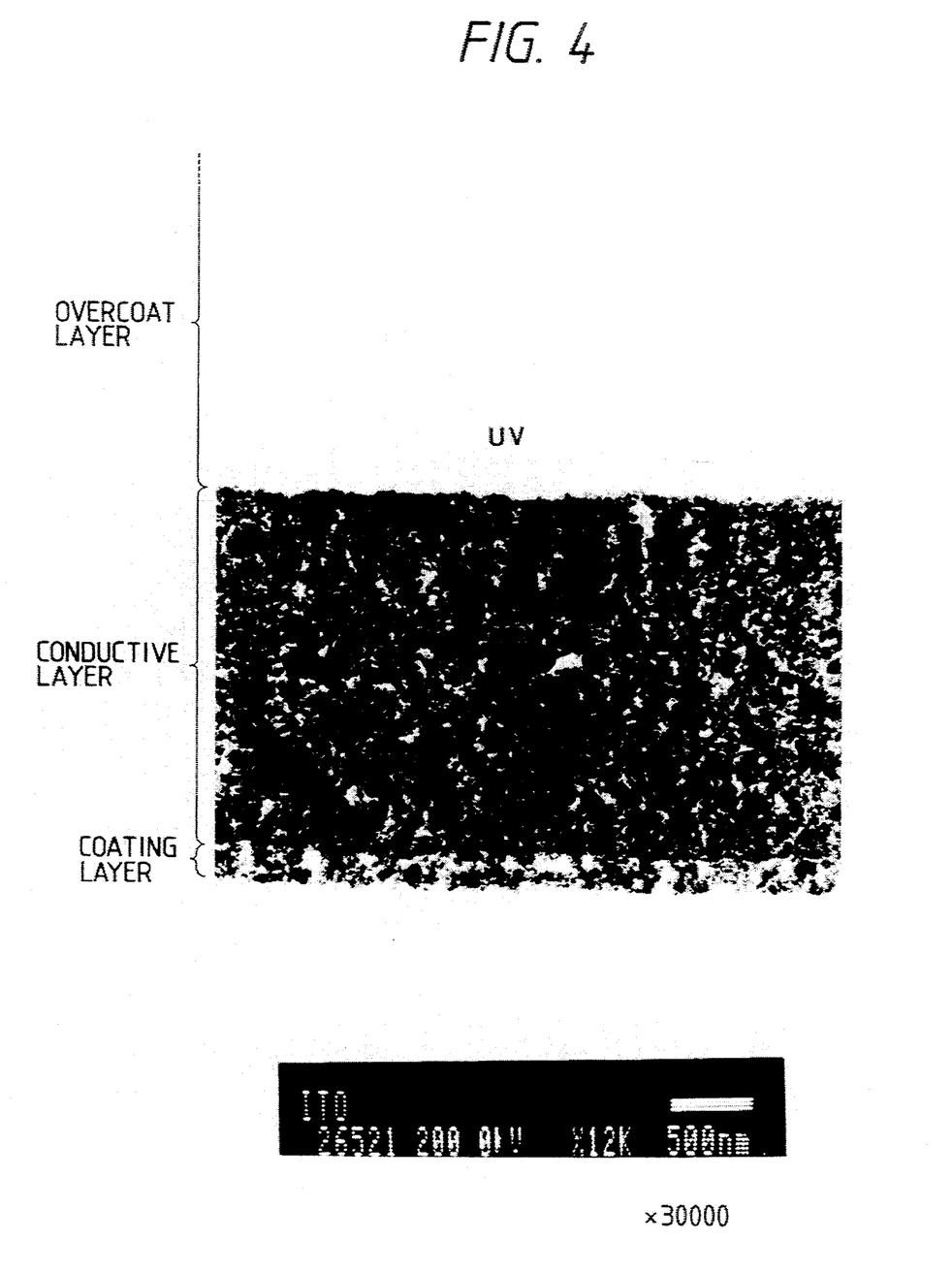
FIG. 4 is a transmission electron micrograph illustrating details of the structure of twenty-third embodiment of the transparent conductive substrate according to the present invention.

Light transmittance, a haze value and surface resistance respectively of the transparent conductive substrate thus obtained were measured. Obtained results are summarized in Table 6. A measurement of surface roughness of this transparent conductive substrate indicated surface irregularities of 0.2 μm or lower. In addition, used for these measurements were the same measuring instruments as those employed for the first embodiment. The thickness of the conductive layer was measured by using a transmission electron micrograph shown in FIG. 4. According to FIG. 4, it can be observed that the coating layer is shrunk by calcination.

Twenty-fourth Embodiment

A transparent conductive substrate was manufactured with the same materials, under the same conditions and in the same procedures as those selected for the twenty-third embodiment, except for the overcoat liquid 5 (see Table 1) which is used for the twenty-fourth embodiment. Measurements of light transmittance, a haze value and surface resistance of the transparent conductive substrate with the same equipment adopted for the first embodiment indicated the results which are listed in Table 6.

Twenty-fifth Embodiment

On a soda-lime glass plate (75 mm long by 75 mm wide by 1 mm thick) selected as the base board, a coating film 0.4 μm thick was formed by applying the coating liquid 4 (see Table 1) containing ultra-fine ITO particles having a particle size of 0.03 μm as the filler and acrylic resin as the binder, drying the coating liquid with heat of far-infrared light at 50° C. for 5 minutes. A coating layer was formed by thermally treating the coating film in a nitrogen gas atmosphere at 400° C. for 10 minutes so as to carbonize the acrylic resin. The ITO dispersion (DX-101) was applied over the coating layer with a wire bar having a diameter of 0.075 mm and dried. A transparent conductive substrate was manufactured by selecting, at subsequent steps, the materials, conditions and procedures which were the same as those used in the twenty-third embodiment. Light transmittance, a haze value and surface resistance of the transparent conductive substrate were measured with the same equipment as that adopted for the first embodiment, and obtained results are listed in Table 6.

Twenty-sixth Embodiment

On a low-alkali glass plate (75 mm long by 75 mm wide by 1 mm thick) selected as the base board, a film approximately 0.04 μm thick was formed by applying the coating liquid 5 (see Table 1) containing cyanoresin with a wire bar having a diameter of 0.1 mm and drying the coating liquid. Since the film was very thin, its thickness was read from a graph which was prepared so as to represent relationship between concentrations of the resin contained in the coating liquid and film thickness. A transparent conductive layer 2.0 μm thick was formed by applying the ITO dispersion (DX-101) with a wire bar having a diameter of 0.075 mm and drying the dispersion. The transparent conductive layer was heated in air at 650° C. for 30 minutes and then in nitrogen gas atmosphere at 650° C. for 10 minutes. A transparent conductive substrate was manufactured by selecting, at subsequent steps, the materials, conditions and procedures which were the same as those adopted for the twenty-third embodiment. Results listed in Table 6 were obtained by measuring light transmittance, a haze value and surface resistance of the transparent conductive substrate with the measuring equipment which was the same as that used in the first embodiment.

Comparison Example 4

A transparent conductive substrate was manufactured with the same materials, under the same conditions and in the same procedures as those selected for the twenty-third embodiment, except for a fact that a coating layer was not formed on the base board. Light transmittance, a haze value and surface resistance of the transparent conductive substrate were measured with the measuring equipment which was the same as that used for the first embodiment, and the results summarized in Table 6 were obtained.

Comparison Example 5

A transparent conductive substrate was manufactured with the same materials, under the same conditions and in the same procedures as those selected for the twenty-fourth embodiment, except for a fact that a coating layer was not formed on the base board. The results listed in Table 6 were obtained by measuring light transmittance, a haze value and surface resistance of the transparent conductive substrate with the measuring equipment which was the same as that adopted for the first embodiment.

Comparison Example 6

On a low-alkali glass plate (75 mm long by 75 mm wide by 1 mm thick) adopted as the base board, a film 0.4 μm thick was formed by applying the coating liquid 6 (see Table 1) containing cyanoresin with a wire bar having a diameter of 0.1 mm and drying the coating liquid. A transparent conductive layer was formed by applying the ITO dispersion (DX-101) over the film with a wire bar having a diameter of 0.075 mm and drying the ITO dispersion. The transparent conductive layer was peeled off completely from the base board when the layer was calcined in air at 650° for 30 minutes.

TABLE 6

| | Coating layer | Overcoat layer | Thickness of conductive layer (μm) | Physical properties of transparent conductive substrate | | | | Offset state | Remarks |
| --- | --- | --- | --- | --- | --- | --- | --- | --- | --- |
| | | | | Surface resistance (Ω/□) | Specific resistance (Ω.cm) | Light transmittance (%) | Haze value (%) | | |
| Twenty-third embodiment | Coating liquid 3 | Overcoat liquid 4 | 2.2 | 42 | $9.2 \times 10^{-3}$ | 85.6 | 3.1 | Favorable | |
| Twenty-fourth embodiment | Coating liquid 3 | Overcoat liquid 5 | 2.2 | 38 | $8.4 \times 10^{-3}$ | 85.6 | 2.8 | Favorable | |
| Twenty-fifth embodiment | Coating liquid 4 | Overcoat liquid 4 | 2.1 | 45 | $9.5 \times 10^{-3}$ | 85.8 | 2.9 | Favorable | |
| Twenty-sixth embodiment | Coating liquid 5 | Overcoat liquid 4 | 2.0 | 30 | $6.0 \times 10^{-3}$ | 85.7 | 3.0 | Favorable | |
| Comparison example 4 | None | Overcoat liquid 4 | | | | | | Not offset partially | |
| Comparison example 5 | None | Overcoat liquid 5 | | | | | | Not offset | |
| Comparison example 6 | Coating liquid 6 | | | | | | | | ITO film peeled off by calcination |

What is claimed is:

1. A transparent electroconductive substrate comprising:

a visible light transmitting base plate member;

a visible light transparent overcoat layer formed on said base plate member, said layer including a material selected from the group consisting of an ultraviolet-setting resin and a thermosetting resin; and a visible light transparent electroconductive film formed on said overcoat layer, including a material selected from the group consisting of an ultraviolet-setting resin and a thermosetting resin, and further including ultra-fine particles of indium-tin oxide dispersed therein, said ultra-fine particles having a particle size of 0.1 μm or smaller, said visible light transparent electroconductive film exhibiting specific resistance between $6 \times 10^{-3}$ and $5 \times 10^{-2}$ Ω.cm.

2. A transparent electroconductive substrate comprising:

a visible light transmitting base plate member;

a visible light transparent overcoat layer formed on said base plate member, said overcoat layer including a material selected from the group consisting of an ultraviolet-setting resin and a thermosetting resin; and a visible light transparent electroconductive film formed on said overcoat layer, including a material selected from the group consisting of one of an ultraviolet-setting resin and a thermosetting resin, and further including ultra-fine particles of indium-tin oxide dispersed therein, said ultra-fine particles having a particle size of 0.1 μm or smaller, said visible light transparent electroconductive film having visible light transmittance of 70% or higher and exhibiting surface resistance of 200 Ω/□ or lower.

3. A transparent electroconductive substrate according to claim 1, wherein said visible light transparent electroconductive film comprises a first layer and a second layer, wherein said second layer is more densely filled with said ultra-fine particles than said first layer, said second layer being located between the first layer and the overcoat layer.

4. A transparent electroconductive substrate according to claim 2, wherein said visible light transparent electroconductive film comprises a first layer and a second layer, wherein said second layer is more densely filled with said ultra-fine particles than said first layer, said second layer being located between the first layer and the overcoat layer.

* * * * *